US012768030B2

(12) United States Patent
Tsai et al.

(10) Patent No.: US 12,768,030 B2
(45) Date of Patent: Oct. 20, 2026

(54) METHOD OF DEPOSITING LAYERS OF A THIN-FILM TRANSISTOR ON A SUBSTRATE AND SPUTTER DEPOSITION APPARATUS

(71) Applicant: Applied Materials, Inc., Santa Clara, CA (US)

(72) Inventors: Yun-chu Tsai, San Jose, CA (US); Dong Kil Yim, Pleasanton, CA (US); Rodney Shunleong Lim, Daly City, CA (US); Jürgen Grillmayer, Chiayi (TW); Jung Bae Kim, San Jose, CA (US); Marcus Bender, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 17/768,918

(22) PCT Filed: May 11, 2020

(86) PCT No.: PCT/EP2020/063055

§ 371 (c)(1),
(2) Date: Apr. 14, 2022

(87) PCT Pub. No.: WO2021/228359

PCT Pub. Date: Nov. 18, 2021

(65) Prior Publication Data

US 2024/0102152 A1 Mar. 28, 2024

(51) Int. Cl.

*C23C 14/34* (2006.01)
*C23C 14/08* (2006.01)
(Continued)

(52) U.S. Cl.

CPC ........ *C23C 14/3485* (2013.01); *C23C 14/083* (2013.01); *C23C 14/086* (2013.01);
(Continued)

(58) Field of Classification Search

CPC . C23C 14/3485; C23C 14/083; C23C 14/086; C23C 14/3464; C23C 14/562; H01L 21/02565; H01L 21/02631
See application file for complete search history.

(56) References Cited

U.S. PATENT DOCUMENTS 6,290,821 B1 * 9/2001 McLeod .............. C23C 14/568 204/192.12
6,488,824 B1 * 12/2002 Hollars .................. C23C 14/35 204/192.12
(Continued)

FOREIGN PATENT DOCUMENTS

CN 105026611 A 11/2015
CN 107359202 A 11/2017
(Continued)

OTHER PUBLICATIONS

Japanese Office Action dated Aug. 8, 2023, for Japanese Patent Application No. 2022-522855.
(Continued)

*Primary Examiner* — Patrick S Ott
(74) *Attorney, Agent, or Firm* — Patterson + Sheridan, LLP

(57) ABSTRACT

A method (480, 580) of depositing layers of a thin-film transistor on a substrate using a sputter deposition source comprising at least one first pair of electrodes and at least one second pair of electrodes, the method comprising moving (482, 582) the substrate to a first vacuum chamber; depositing (484, 584) a first layer of the layers on the substrate by supplying the at least one first pair of electrodes with bipolar pulsed DC voltage, wherein a first material of the first layer comprises a first metal oxide; moving (486, 586) the substrate from the first vacuum chamber to a second vacuum chamber without a vacuum break; and depositing (488, 588) a second layer of the layers on the first layer by
(Continued)

supplying the at least one second pair of electrodes with bipolar pulsed DC voltage, wherein a second material of the second layer comprises a second metal oxide, the second material being different from the first material.

18 Claims, 3 Drawing Sheets

(51) Int. Cl.
*C23C 14/56* (2006.01)
*H10P 14/20* (2026.01)
*H10P 14/22* (2026.01)

(52) U.S. Cl.
CPC ........ *C23C 14/3464* (2013.01); *C23C 14/562* (2013.01); *H10P 14/22* (2026.01); *H10P 14/3434* (2026.01)

(56) References Cited

U.S. PATENT DOCUMENTS

| | | | | |
|---|---|---|---|---|
| 8,232,551 | B2 * | 7/2012 | Kim | H01L 29/78696 257/43 |
| 2010/0001272 | A1 * | 1/2010 | Ye | H01L 21/02631 257/E21.414 |
| 2011/0315980 | A1 * | 12/2011 | Kim | H10D 99/00 257/E29.296 |
| 2012/0012840 | A1 * | 1/2012 | Korthuis | H10D 30/6757 257/E29.296 |
| 2012/0187407 | A1 * | 7/2012 | Choi | H01L 29/45 257/E21.414 |
| 2014/0145183 | A1 * | 5/2014 | Yamazaki | H01L 21/02631 257/43 |
| 2016/0049517 | A1 * | 2/2016 | Lee | H10D 30/6757 257/43 |
| 2017/0117416 | A1 * | 4/2017 | Wang | H01L 29/78696 |
| 2017/0213708 | A1 * | 7/2017 | Kleideter | H01J 37/32889 |
| 2017/0317274 | A1 | 11/2017 | Seino | |
| 2019/0233936 | A1 | 8/2019 | Fiukowski et al. | |
| 2020/0098753 | A1 * | 3/2020 | Dewey | H10D 84/017 |
| 2020/0411697 | A1 * | 12/2020 | Ku | H10D 86/201 |

FOREIGN PATENT DOCUMENTS

| | | | | |
|---|---|---|---|---|
| CN | 110050325 | A | 7/2019 | |
| EP | 3399539 | A1 | 11/2018 | |
| JP | 2010077452 | A | 4/2010 | |
| JP | 2010520621 | A | 6/2010 | |
| JP | 2014057056 | A | 3/2014 | |
| JP | 2017204641 | A | 11/2017 | |
| JP | 2020503436 | A | 1/2020 | |
| KR | 101761804 | B1 | 8/2017 | |
| KR | 20180107164 | A | 10/2018 | |
| KR | 20190094223 | A | 8/2019 | |
| WO | 2008109311 | A2 | 9/2008 | |
| WO | 2011132418 | A1 | 10/2011 | |
| WO | 2016125200 | A1 | 8/2016 | |
| WO | WO-2018113904 | A1 * | 6/2018 | C23C 14/3407 |
| WO | WO-2018145751 | A1 * | 8/2018 | C23C 14/02 |
| WO | 2019/154490 | A1 | 8/2019 | |
| WO | 2020/025153 | A1 | 2/2020 | |
| WO | 2020025102 | A1 | 2/2020 | |

OTHER PUBLICATIONS

Office Action for Japanese Application No. 2022-522855 dated Jan. 30, 2024.

International Search Report and Written Opinion, PCT/EP2020/063055, Feb. 10, 2021.

Chinese Office Action dated Dec. 26, 2023 for Application No. 202080076497.9.

Korean Office Action dated Jun. 24, 2024 for Application No. 10-2022-7013858.

Korean Office Action dated Feb. 13, 2025 for Application No. 10-2022-7013858, 12 pages.

Chinese Office Action dated May 21, 2025 for Application No. 202080076497.9.

Notice of Allowance from Korean Patent Application No. 10-2022-7013858 dated Apr. 8, 2026.

* cited by examiner

METHOD OF DEPOSITING LAYERS OF A THIN-FILM TRANSISTOR ON A SUBSTRATE AND SPUTTER DEPOSITION APPARATUS

TECHNICAL FIELD

The present disclosure relates to manufacturing of semiconductor devices, particularly a thin-film transistor. The present disclosure relates to a method of depositing layers of a thin-film transistor on a substrate. The present disclosure further relates to a sputter deposition apparatus.

BACKGROUND

Forming thin layers on a substrate is a relevant issue, particularly in the field of thin film transistors (TFTs). In the fabrication of thin-film transistors, one method of forming a layer on a substrate is sputtering. During sputtering, atoms are ejected from the material of a sputter target by bombardment thereof with energetic particles of a plasma (e.g., energized ions of an inert or reactive gas). The ejected atoms may deposit on the substrate, so that a layer of sputtered material can be formed on the substrate.

Known methods for depositing layers on a substrate for thin-film transistor fabrication utilize a static deposition process in which the substrate is positioned in front of sputter electrodes of a deposition source. The deposition source may include at least one sputter electrode, e.g. a sputter cathode carrying a sputter target, or an array of sputter electrodes that are powered with a direct current (DC) for DC sputtering.

The fabrication of a thin-film transistor may involve the deposition of various layers including e.g. a gate insulation layer, a channel layer for forming a channel between a source electrode and a drain electrode, or a source-drain layer for forming the source electrode and the drain electrode.

Providing thin-film transistors with a uniform and stable performance, e.g. for an application in displays, remains challenging. For instance, the performance of thin-film transistors may be unstable under stress, e.g. during the application of a voltage to the thin-film transistor and/or at elevated temperatures. In particular, the performance of thin-film transistors with high carrier mobility may be unstable. For example, it can be difficult to apply thin-film transistors with high carrier mobility in high resolution mobile panels.

Thus, there is a continuing demand for providing an improved method of depositing layers of a thin-film transistor on a substrate and for a sputter deposition apparatus. More specifically, it would be desirable to provide thin-film transistors having high carrier mobility and high stability, particularly under stress.

SUMMARY

In light of the above, a method of depositing layers of a thin-film transistor on a substrate as well as a sputter deposition apparatus according to the independent claims are provided. Further aspects, advantages, and features of the present disclosure are apparent from the dependent claims, the description, and the accompanying drawings.

An aspect of the present disclosure relates to a method of depositing layers of a thin-film transistor on a substrate using a sputter deposition source including at least one first pair of electrodes and at least one second pair of electrodes. The method includes moving the substrate to a first vacuum chamber; depositing a first layer of the layers on the substrate by supplying the at least one first pair of electrodes with bipolar pulsed DC voltage, wherein a first material of the first layer includes a first metal oxide; moving the substrate from the first vacuum chamber to a second vacuum chamber without a vacuum break; and depositing a second layer of the layers on the first layer by supplying the at least one second pair of electrodes with bipolar pulsed DC voltage, wherein a second material of the second layer includes a second metal oxide, the second material being different from the first material.

A further aspect relates to a sputter deposition apparatus, particularly for depositing layers of a thin-film transistor on a substrate. The sputter deposition apparatus includes a first vacuum chamber and a second vacuum chamber being arranged such that the substrate is transferrable between the first vacuum chamber and the second vacuum chamber without a vacuum break. The sputter deposition apparatus includes a sputter deposition source including at least one first pair of electrodes and at least one second pair of electrodes, wherein the at least one first pair of electrodes is arranged in the first vacuum chamber, and wherein the at least one second pair of electrodes is arranged in the second vacuum chamber. The sputter deposition source further includes a power supply arrangement configured to supply the at least one first pair of electrodes and the at least one second pair of electrodes with bipolar pulsed DC voltage. The at least one first pair of electrodes includes first targets having a first target material, the first target material including a first metal oxide. The at least one second pair of electrodes includes second targets having a second target material, the second target material including a second metal oxide and the second target material being different from the first target material.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following. Typical embodiments are depicted in the drawings and are detailed in the description which follows.

DETAILED DESCRIPTION

Figure 1:
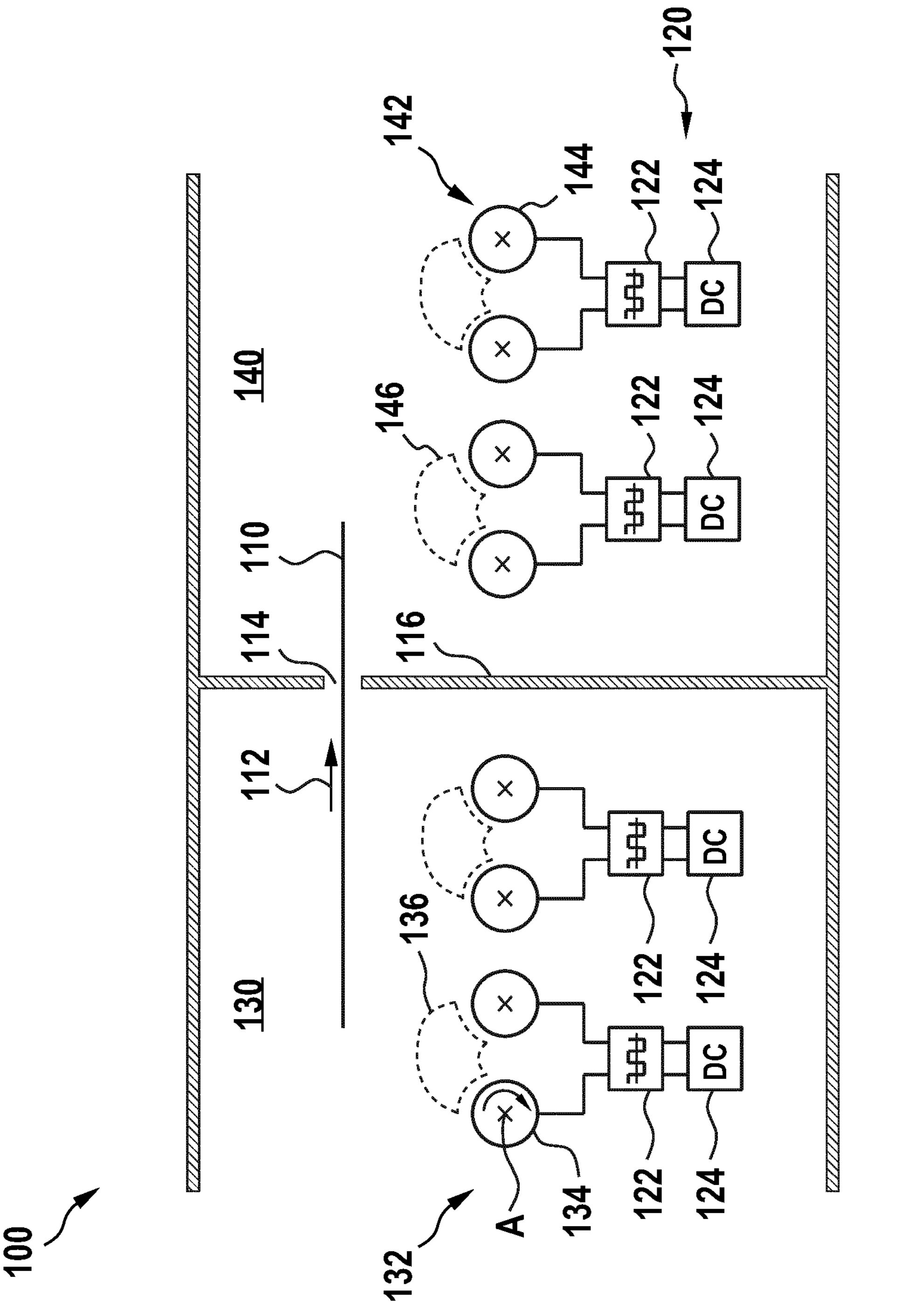
FIG. 1 shows a schematic view of a sputter deposition source in accordance with some embodiments described herein.

Reference will now be made in detail to the various embodiments, examples of which are illustrated in the figures. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

The process of coating a substrate with a material as described herein refers typically to thin-film applications. The term "coating" and the term "depositing" are used synonymously. According to some embodiments, coating or depositing is performed by sputtering.

A sputter deposition apparatus according to embodiments described herein includes a first vacuum chamber and a second vacuum chamber. The first vacuum chamber and the second vacuum chamber are arranged such that a substrate can be transferred without a vacuum break between the first vacuum chamber and the second vacuum chamber. In particular, the sputter deposition apparatus is configured such that a substrate can be moved from the first vacuum chamber to the second vacuum chamber without an exposure of the substrate to a non-vacuum environment, in particular without exposure to an environment with atmospheric pressure. The first vacuum chamber may be at least partially separated from the second vacuum chamber by a chamber wall of the first vacuum chamber or the second vacuum chamber. The chamber wall may have a slit opening. The slit opening may be configured such that a substrate, particularly a substrate and a substrate carrier holding the substrate, may be moved from the first vacuum chamber through the slit opening to the second vacuum chamber. In some embodiments, the slit opening may be closable or sealable using a chamber valve.

According to embodiments, the sputter deposition apparatus includes a sputter deposition source. The sputter deposition source includes pairs of electrodes, in particular at least one first pair of electrodes and at least one second pair of electrodes. Each electrode of the pairs of electrodes may be configured for providing a target material to be deposited on the substrate. For example, each electrode may include a target, e.g. a cylindrical target, made of the target material to be deposited on the substrate. Further, each electrode may be configured to be rotatable around a respective rotation axis together with the target material. The electrodes of a pair of electrodes may be adjacent electrodes. For example, each pair of electrodes may include a first electrode and a second electrode which are arranged at a distance of 50 cm or less, particularly 30 cm or less.

Generally, sputtering can be performed as diode sputtering or as magnetron sputtering. Magnetron sputtering is particularly advantageous in that the deposition rates can be high. A magnet assembly can be positioned within a rotatable electrode. By arranging the magnet assembly within the rotatable electrode, i.e. inside a cylindrical target, free electrons above a target surface are forced to move within a magnetic field generated by the magnet assembly and cannot escape. The magnet assembly may be rotatable within the electrode. Magnetron sputtering may increase the deposition rate.

FIG. 1 shows an exemplary embodiment of a sputter deposition apparatus 100. The sputter deposition apparatus 100 includes a first vacuum chamber 130 and a second vacuum chamber 140. A substrate 110 may be moved from the first vacuum chamber 130 to the second vacuum chamber 140 without a vacuum break. In particular, the substrate 110 may be held by a substrate carrier. The substrate carrier holding the substrate 110 may be moved along a substrate transportation track in a downstream direction 112. As shown in FIG. 1, the substrate 110 may be moved in a downstream direction 112 from the first vacuum chamber 130 through a slit opening 114 of a chamber wall 116 to the second vacuum chamber 140. The sputter deposition apparatus 100 may be configured to continuously move the substrate 110 during deposition in the first vacuum chamber 130 and during deposition in the second vacuum chamber 140.

According to some embodiments, the sputter deposition apparatus is configured for dynamic coating of substrates, particularly in the first vacuum chamber and/or in the second vacuum chamber. For example, the sputter deposition apparatus may be configured to continuously move the substrate along the substrate transportation track during depositing of layers. In further embodiments, the sputter deposition apparatus may be configured for static coating of the substrate. A substrate may enter a coating area before deposition, particularly a coating area within the first vacuum chamber or within the second vacuum chamber. After entering the coating area, the sputter deposition apparatus may be configured for depositing a layer on the substrate. The substrate remains within the coating area during the deposition. The sputter deposition apparatus may be configured to take the substrate out of the coating area after the deposition. In particular, a vacuum chamber, e.g. the first vacuum chamber or the second vacuum chamber, may be sealable or closable with respect to the environment or neighbouring vacuum chambers during deposition, e.g. using a chamber valve.

According to embodiments, the sputter deposition source of the sputter deposition apparatus includes at least one first pair of electrodes arranged in the first vacuum chamber, and at least one second pair of electrodes arranged in the second vacuum chamber. The at least one first pair of electrodes and/or the at least one second pair of electrodes may include at least two or at least three pairs of electrodes, e.g. exactly two or exactly three pairs of electrodes. The sputter deposition source includes a power supply arrangement configured to supply the at least one first pair of electrodes and the at least one second pair of electrodes with bipolar pulsed DC voltage. In the embodiment shown in FIG. 1, the sputter deposition apparatus 100 includes a sputter deposition source with two first pairs of electrodes 132 arranged in the first vacuum chamber 130 and two second pairs of electrodes 142 arranged in the second vacuum chamber 140. The first pairs of electrodes 132 and the second pairs of electrodes 142 are supplied with bipolar pulsed DC voltage by a power supply arrangement 120. The power supply arrangement 120 can include a DC power supply 124 and a pulsing unit 122. A first plasma 136 for sputtering is formed between the electrodes of each of the first pairs of electrodes 132. A second plasma 146 for sputtering is formed between the electrodes of each of the second pairs of electrodes 142.

Figure 2:
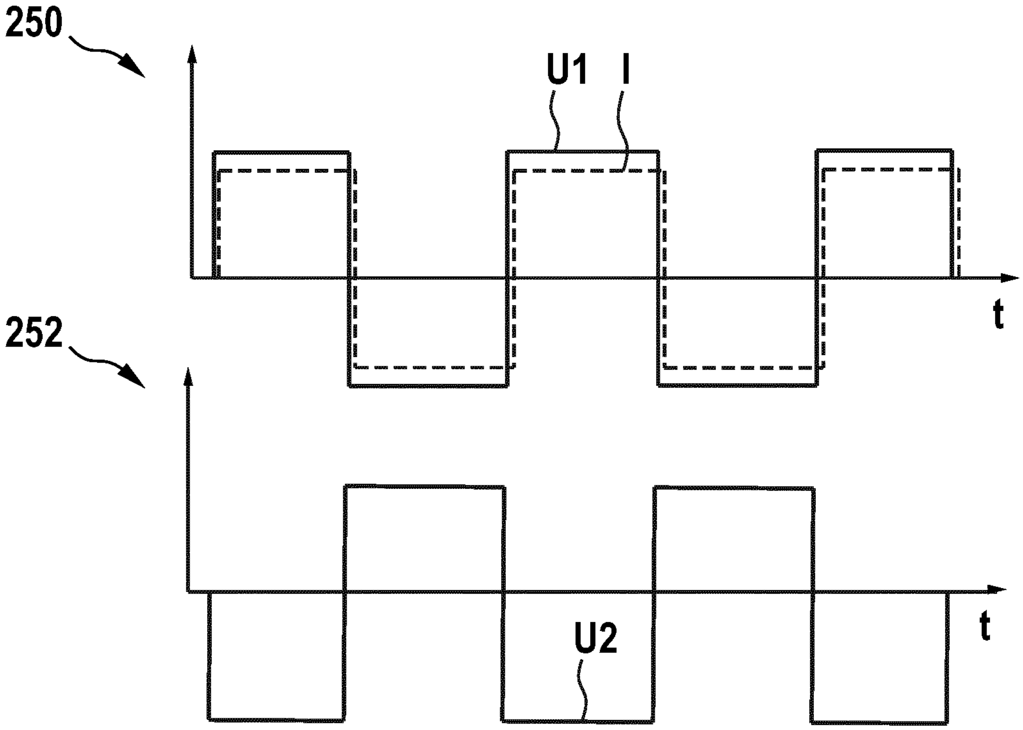
FIG. 2 shows graphs of a bipolar pulsed DC voltage and a respective current that may be applied to a pair of electrodes in a sputter deposition source in accordance with embodiments described herein.

FIG. 2 is a graph showing a bipolar pulsed DC voltage that may be applied to a pair of electrodes in a sputter deposition source in accordance with embodiments described herein, as a function of the time (t). The first graph 250 shows a first voltage U1 applied to the first electrode of a pair of electrodes, and the second graph 252 shows a second voltage U2 applied to the second electrode of the pair of electrodes. The second voltage U2 may be for example the inverted first voltage U1. In the exemplary embodiment, a bipolar square wave or rectangular wave voltage is applied to the pair of electrodes. In reality, the positive and negative parts of the first voltage and the second voltage may only be approximately constant. A corresponding voltage may be synchronously applied to each pair of electrodes of the at least one first pair of electrodes and the at least one second pair of electrodes.

Further, the current (I) flowing between the electrodes of a pair of electrodes during operation is illustrated as a function of the time (t) in the first graph 250 of FIG. 2. The current may follow the shape of the applied voltage waveform. In particular, the frequency of the current may correspond to the frequency of the applied voltage.

According to embodiments, the at least one first pair of electrodes includes first targets having a first target material, the first target material including a first metal oxide. The at least one second pair of electrodes includes second targets having a second target material, the second target material including a second metal oxide. In particular, the second target material is different from the first target material. In embodiments, at least one of the first target material and the second target material may be a semiconductor.

In embodiments, the sputter deposition apparatus may be configured for depositing layers of a thin-film transistor on a substrate. In particular, the sputter deposition apparatus may be configured for depositing layers according to embodiments of a method described herein. In particular, the first target material may be configured for depositing a first layer of the layers, wherein a first material of the first layer includes material of the first target material, particularly the first metal oxide of the first target material. The second target material may be configured for depositing a second layer of the layers, wherein a second material of the second layer includes material of the second target material, particularly the second metal oxide of the second target material. In particular, the first target material and the second target material may be configured for deposition of channel layers of a thin-film transistor. In some embodiments, the first target material and the second target material may at least essentially correspond to the first material of the first layer and the second material of the second layer, respectively, the first material and the second material being configured according to embodiments described herein.

In some embodiments, the first targets and the second targets are rotary targets. As shown in FIG. 1, the first pairs of electrodes 132 include first targets 134 and the second pairs of electrodes include second targets 144. Each of the first targets 134 and the second targets 144 are rotary targets. In particular, each of the first targets 134 and the second targets 144 are rotatable around a respective axis A of rotation.

According to embodiments, the sputter deposition apparatus may include a substrate transportation track, along which the substrate can be transported. In particular, the substrate may be moved along the substrate transportation track to the first vacuum chamber and/or from the first vacuum chamber to the second vacuum chamber. The substrates may be carried along the substrate transportation track by substrate carriers during the transport and/or during substrate processing, particularly during the depositing of layers.

In some embodiments, the sputter deposition apparatus may include at least one further vacuum chamber having at least one further pair of electrodes of the sputter deposition source disposed therein. The sputter deposition apparatus, particularly a substrate transportation track of the sputter deposition apparatus, may be configured such that a substrate may be moved from the second vacuum chamber to the at least one further vacuum chamber without a vacuum break. The at least one further pair of electrodes may include at least one further target, wherein a further target of the at least one further target includes a further target material. The further target material can be different from the second target material, in particular different from the first target material and different from the second target material. In embodiments, the further target material may have a different carrier mobility and/or a different carrier concentration with respect to the second target material.

According to embodiments, which can be combined with other embodiments, a method of depositing layers of a thin-film transistor on a substrate is provided. A sputter deposition source including at least one first pair of electrodes and at least one second pair of electrodes is used for depositing the layers of the thin-film transistor. In particular, a sputter deposition source of a sputter deposition apparatus according to embodiments described herein may be used for depositing the layers of the thin-film transistor.

Figure 3:
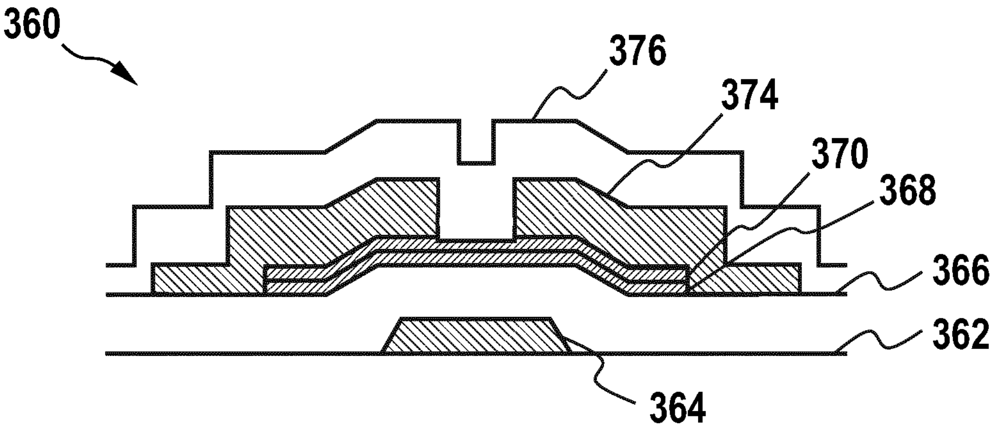
FIG. 3 shows a schematic illustration of an exemplary thin-film transistor including layers deposited by a method or a sputter deposition source according to embodiments described herein.

In FIG. 3, an exemplary illustration of a thin-film transistor 360 is shown. The fabrication of the thin-film transistor 360 may include a method of depositing layers of the thin-film transistor 360 according to embodiments described herein. The thin-film transistor 360 includes a supporting substrate 362. On the supporting substrate 362, a gate electrode 364 is formed. On the gate electrode 364, a gate insulation layer 366 is deposited. The gate insulation layer 366 includes insulating material. For example, the gate insulation layer 366 may include silicon nitride ($SiN_x$), silicon oxide ($SiO_x$), $SiO_xN_{(1-x)}$, a material having a high dielectric constant, particularly $Al_xO_y$, $ZrO_x$, $HfO_x$, or $GeO_x$, or any combination thereof.

On the gate insulation layer 366, a channel of the thin-film transistor 360 may be formed. The channel may include semiconducting material. The channel may particularly be conductive in an ON-state of the thin-film transistor and not conductive in an OFF-state of the thin-film transistor. In particular, the channel may be formed by depositing a first layer 368, particularly forming a front channel of the thin-film transistor 360, and by depositing a second layer 370, particularly forming a back channel of the thin-film transistor 360. The first layer 368 may be formed of a first material and the second layer 370 may be formed of a second material, the second material being different from the first material. Each of the first material and the second material may be semiconducting materials. For instance, the first layer 368 may include indium gallium zinc oxide (IGZO) in a partially oxidized state and the second layer 370 may include IGZO in a fully oxidized state. According to another example, the first layer 368 may be formed of a composition of IGZO and a transparent conductive oxide such as indium tin oxide (ITO) indium zinc oxide (IZO), or aluminium zinc oxide (AZO) and the second layer 370 may for example include IGZO without the transparent conductive oxide.

The thin-film transistor 360 further includes a source-drain layer 374. The source-drain layer 374 may include a conductive material. The source-drain layer 374 may include or may consist of metal. For example, the source-drain layer 374 may include Mo, Ti, Ta, Cr, (Ta, Cr), Cu, Ag, Al, alloys thereof or any combinations thereof. The source-drain layer 374 may be structured, e.g. by photolithography, to form a source electrode and a drain electrode of the thin-film transistor 360. The thin-film transistor 360 may be further processed by back-channel etching. In particular, a back channel, e.g. the second layer 370, may be partially etched. The thin-film transistor 360 further includes a passivation layer 376 deposited on the source-drain layer 374.

FIG. 3 shows a specific type of thin-film transistor for illustrative purposes, in particular a thin-film transistor of an inverted-staggered configuration. In some embodiments, methods and apparatus as disclosed herein may be configured for depositing layers of a thin-film-transistor of an inverted-staggered configuration, particularly for a fabrication of the thin-film transistor including a back-channel etch. Embodiments of methods and apparatus described herein may additionally or alternatively be used for depositing layers of thin-film transistors other than inverted-staggered configurations.

Figure 4:
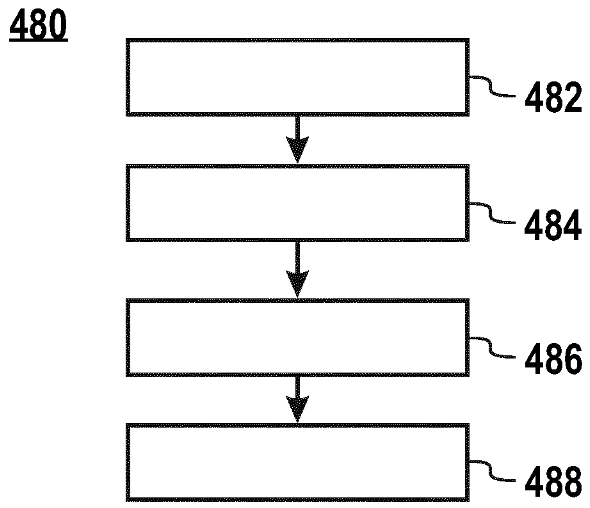
FIG. 4 shows a flow diagram illustrating a method according to embodiments described herein.

FIG. 4 shows a flow diagram illustrating a method 480 of depositing layers of a thin film transistor according to embodiments described herein. At 482, the method 480 includes moving the substrate to the first vacuum chamber. In embodiments, the substrate may be moved to the first vacuum chamber from a load lock chamber or from a preceding processing chamber.

At 484, the method 480 includes depositing a first layer of the layers on the substrate by supplying the at least one first pair of electrodes with bipolar pulsed DC voltage, wherein a first material of the first layer includes a first metal oxide. In some embodiments, the first layer forms a channel of the thin-film transistor, particularly a front channel of the thin-film transistor. In embodiments, the first layer is deposited on a gate insulation layer of the thin-film transistor. The gate insulation layer may include or consist of an insulating material.

At 486, the substrate is moved from the first vacuum chamber to a second vacuum chamber without a vacuum break. Moving the substrate from the first vacuum chamber to the second vacuum chamber without a vacuum break may prevent an interaction of atmospheric gases, in particular of atmospheric oxygen, with the first layer. An interaction of atmospheric gases may change material properties of the first layer and/or may affect the operation of the thin-film transistor.

At 488, the method 480 includes depositing a second layer of the layers on the first layer by supplying the at least one second pair of electrodes with bipolar pulsed DC voltage. A second material of the second layer includes a second metal oxide, wherein the second material is different from the first material of the first layer. In some embodiments, the second layer forms a back channel of the thin-film transistor. In particular, the channel may be a dual-channel layer structure. In further embodiments, the second layer may form an intermediate channel layer of the thin film transistor. Forming a channel of a thin-film transistor by the deposition of more than one layer of different materials, in particular by depositing a first layer and a second layer according to embodiments, may increase the stability of the thin-film transistor under stress.

According to some embodiments, one of the first material and the second material includes a different metal with respect to the other one of the first material and the second material. In particular, one of the first metal oxide and the second metal oxide may include a different metal with respect to the other one of the first metal oxide and the second metal oxide. In embodiments, in particular in embodiments of the sputter deposition apparatus, one of the first target material and the second target material includes a different metal with respect to the other one of the first target material and the second target material.

In some embodiments, which can be combined with other embodiments, the first metal oxide of the first material or of the first target material includes elements in a first stoichiometry and the second metal oxide of the second material or of the second target material includes the elements in a second stoichiometry. The second stoichiometry can be different from the first stoichiometry. In particular, the elements can include at least two selected from the group consisting of indium, gallium and zinc.

In embodiments, the first metal oxide includes an element in a first oxidation state and the second metal oxide includes the element in a second oxidation state, the second oxidation state being different from the first oxidation state. For example, the first metal oxide and the second metal oxide may include at least one element selected from the group consisting of indium, gallium, zinc, tin and aluminium, in particular indium, gallium and zinc. A first oxidation state of the at least one element in the first metal oxide may be different from a second oxidation state of the at least one element in the second metal oxide.

According to embodiments, the first material or the first target material has a different carrier mobility with respect to the second material or the second target material. In particular, the first metal oxide may have a different carrier mobility with respect to the second metal oxide. The term "carrier mobility" as used herein refers to the mobility of charge carriers in a material such as a semiconductor material. In particular, the carrier mobility may refer to the mobility of holes and/or to the mobility of electrons. For example, one of the first material and the second material may have a high carrier mobility. The other one of the first material and the second material may have a low or medium carrier mobility. A high carrier mobility may be a carrier mobility higher than 30 $cm^2/Vs$, particularly higher than 50 $cm^2/Vs$. A low carrier mobility may be a carrier mobility lower than 10 $cm^2/Vs$, particularly lower than 7 $cm^2/Vs$ or lower than 5 $cm^2/Vs$. A medium carrier mobility can be a mobility in a range between a high carrier mobility and a low carrier mobility. In further embodiments, one of the first material and the second material may have a high or medium carrier mobility. The other one of the first material and the second material may have a low carrier mobility.

In exemplary embodiments of the sputter deposition apparatus, one of the first target material and the second target material may have a high carrier mobility. The other one of the first target material and the second target material may have a low or medium carrier mobility. In further embodiments, one of the first target material and the second target material may have a high or medium carrier mobility. The other one of the first target material and the second target material may have a low carrier mobility.

In some embodiments, the first material has a different carrier concentration with respect to the second material. In particular, the first metal oxide can have a different carrier concentration with respect to the second metal oxide. In embodiments, the first target material may have a different carrier concentration with respect to the second target material. The term "carrier concentration" as used herein refers to the concentration of charge carriers in a material such as a semiconductor material. In particular, the carrier concentration may refer to the concentration of holes and/or to the concentration of electrons.

In some embodiments, the first material may have a higher carrier mobility and/or a higher carrier concentration than the second material. In embodiments of the sputter deposition apparatus, the first target material may have a higher carrier mobility and/or a higher carrier concentration than the second target material.

In further embodiments, the first material may have a lower carrier mobility and/or a lower carrier concentration than the second material. In further embodiments of the sputter deposition apparatus, the first target material may have a lower carrier mobility and/or a lower carrier concentration than the second target material.

According to embodiments, at least one of the first metal oxide and the second metal oxide is indium gallium zinc oxide (IGZO), indium zinc tin oxide (IZTO), indium gallium zinc tin oxide (IGZTO), indium tin oxide (ITO), indium zinc oxide (IZO) or aluminium zinc oxide (AZO). In some embodiments, the first metal oxide may be one of IGZO, IZTO, IGZTO, ITO, IZO or AZO and the second metal oxide may be a different one selected from the group consisting of IGZO, IZTO, IGZTO, ITO, IZO or AZO. For example, one of the first metal oxide and the second metal oxide may be a transparent conductive oxide, particularly ITO, IZO or AZO, and the other one of the first metal oxide and the second metal oxide may be IGZO.

In some embodiments, the first metal oxide and the second metal oxide may include different compositions of one of IGZO, IZTO, IGZTO, ITO, IZO or AZO. For example, one of the first metal oxide and the second metal oxide may include a 1:1:1 (indium:gallium:zinc) composition of IGZO, and the other of the first metal oxide and the second metal oxide may include a different composition of IGZO, e.g. 1:a:b (indium:gallium:zinc) with at least one of a and b being different from 1, e.g. higher or lower than 1.

In exemplary embodiments, the first metal oxide may include indium, gallium and zinc in a first oxidation state. The second metal oxide may include indium, gallium and zinc in a second oxidation state, wherein the second oxidation state is higher or lower than the first oxidation state. In some embodiments, one of the first oxidation state and the second oxidation state may be a fully oxidized state. The combination of a first layer of a first material and a second layer of a second material, wherein the first material and the second material have different carrier mobilities and/or different carrier concentrations, can advantageously enlarge the process window for thin-film transistors having higher stability under stress and/or higher mobility.

In some embodiments, at least one of the first material and the second material, particularly one of the first material and the second material, includes a further metal oxide, particularly in addition to the first metal oxide and/or the second metal oxide. In embodiments, a further metal oxide included in the first material may be different from the first metal oxide. A further metal oxide included in the second material may be different from the second metal oxide. In some embodiments, the further metal oxide may be included in one of the first material and the second material. In further embodiments, the first material and the second material may include a further metal oxide. The first material and the second material can have different contents, e.g. mass fractions, of the further metal oxide.

According to embodiments, the further metal oxide can include aluminium oxide, particularly $Al_2O_3$, and/or tin oxide, particularly $SnO_2$. Additionally or alternatively, the further metal oxide can include at least one transparent conductive oxide, particularly indium tin oxide (ITO), indium zinc oxide (IZO) and/or aluminium zinc oxide (AZO). In particular, the first metal oxide and/or the second metal oxide may be IGZO, IZTO, IGZTO, ITO, IZO or AZO. Including a further metal oxide, e.g. a transparent conductive oxide, in the first material or the second material may increase at least one of a carrier concentration and a carrier mobility of the respective material. In particular, the mobility of the thin-film transistor can be improved. According to embodiments of the sputter deposition apparatus, at least one of the first target material and the second target material, particularly one of the first target material and the second target material, includes the further metal oxide.

According to some embodiments, the first layer and the second layer may be deposited as a layer stack, particularly as a dual layer. In further embodiments, the first layer, the second layer and a third layer may be deposited as a layer stack, particularly as a tri-layer. In embodiments, the layer stack may form a layered channel of a thin-film transistor.

According to embodiments, process gases may be provided during depositing. Process gases may include inert gases such as argon and/or reactive gases such as oxygen, nitrogen, hydrogen and ammonia, ozone, activated gases or the like.

According to some embodiments, the substrate is continuously moved during depositing the first layer and during depositing the second layer ("dynamic coating"). Dynamic coating of the substrate, particularly dynamic deposition of the first layer and the second layer, may provide uniform layer thicknesses, particularly without a target imprint and/or without process drift along the target lifetime. In further embodiments, the first layer and the second layer may be deposited by static coating. A substrate may enter a coating area before deposition, after which a layer is deposited on the substrate. The substrate remains within the coating area during the deposition and the substrate is taken out of the coating area after the deposition. In particular, a vacuum chamber, e.g. the first vacuum chamber or the second vacuum chamber, may be sealed or closed with respect to the environment or neighbouring vacuum chambers during deposition, e.g. using a chamber valve.

According to embodiments, which may be combined with other embodiments described herein, a method may include moving the substrate to at least one further vacuum chamber for depositing at least one further layer on the substrate, e.g. a third layer. The substrate may be moved without a vacuum break. The at least one further layer may be deposited using at least one further pair of electrodes. In particular, the at least one further pair of electrodes may be supplied with bipolar pulsed DC voltage. The first layer, the second layer and the at least one further layer may form a layered channel of the thin-film transistor, e.g. a multi-layered channel. The first layer may particularly form the front channel of the channel. In some embodiments, the at least one further layer may include a further channel layer. The further channel layer may include a further material. In particular, the further material may have at least one of a different carrier mobility and a different carrier concentration with respect to the second material.

Figure 5:
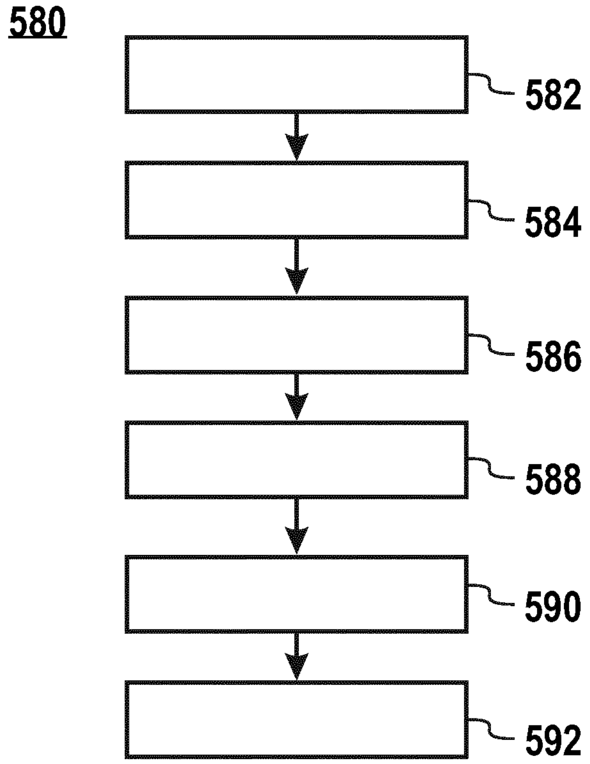
FIG. 5 shows a flow diagram illustrating a method according to further embodiments described herein.

For example, FIG. 5 shows an exemplary flow diagram of a method 580 according to embodiments described herein. In particular, 582-588 of method 580 may correspond to 482-488 of method 480 of FIG. 4. At 590, the method 580 includes moving the substrate from the second vacuum chamber to a third vacuum chamber without a vacuum break. At 592, a third layer of the layers is deposited on the second layer using at least one third pair of electrodes. The third pair of electrodes can be supplied with bipolar pulsed DC voltage. A third material of the third layer can include a third metal oxide, the third material being different from the second material. The third material may have at least one of a different carrier mobility and a different carrier concentration with respect to the second material. In embodiments, the third metal oxide may be IGZO, IZTO, IGZTO, ITO, IZO or AZO. The third material may further include a further metal oxide, e.g. tin oxide, aluminium oxide and/or at least one transparent conductive oxide such as ITO, IZO and/or AZO.

According to the present disclosure, the term "substrate" as used herein embraces both inflexible substrates, e.g., a glass substrate, a wafer, slices of transparent crystal such as sapphire or the like, or a glass plate, and flexible substrates, such as a web or a foil. According to some implementations, embodiments described herein can be utilized for Display PVD, i.e. sputter deposition on large area substrates for the display market. The deposition apparatus may be configured for the deposition of layers on at least one of semiconductor, metal, and glass substrates. In particular, the deposition apparatus may be configured for the manufacture of at least one of semiconductor devices and display devices.

According to some embodiments, large area substrates or respective substrate carriers, wherein the substrate carriers may carry one substrate or a plurality of substrates, may have a size of at least 1 $m^2$. The size may be from about 0.67 $m^2$ (0.73 m×0.92 m—GEN 4.5) to about 8 $m^2$, more specifically from about 2 $m^2$ to about 9 $m^2$, or even up to 12 $m^2$. The substrates or carriers, for which the structures, apparatuses, such as cathode assemblies, and methods according to embodiments described herein are provided, can be large area substrates as described herein. For instance, a large area substrate or substrate carrier can be GEN 4.5, which corresponds to about 0.67 $m^2$ substrates (0.73 m×0.92 m), GEN 5, which corresponds to about 1.4 $m^2$ substrates (1.1 m×1.3 m), GEN 7.5, which corresponds to about 4.29 $m^2$ substrates (1.95 m×2.2 m), GEN 8.5, which corresponds to about 5.7 $m^2$ substrates (2.2 m×2.5 m), or even GEN 10, which corresponds to about 8.7 $m^2$ substrates (2.94 m×3.37 m). Even larger generations such as GEN 11 and GEN 12 and corresponding substrates can similarly be implemented.

According to some embodiments, which can be combined with other embodiments described herein, the substrate may be carried along a substrate transportation track and/or during processing, particularly during depositing, in a substantially vertical orientation. As used herein, "substantially vertical" is understood particularly when referring to the substrate orientation, to allow for a deviation from the vertical direction or orientation of ±20° or below, e.g. of ±10° or below. This deviation can be provided for example because a substrate support with some deviation from the vertical orientation might result in a more stable substrate position. Yet, the substrate orientation, e.g., during transport along the substrate transportation track and/or substrate processing is considered substantially vertical, which is considered different from the horizontal substrate orientation.

A bipolar pulsed DC voltage as referred to herein is a voltage with an alternating polarity ("bipolar") that is applied to the electrodes of a pair of electrodes. Accordingly, a first electrode of a pair of electrodes acts alternately as a cathode and as an anode, and a second electrode of the pair of electrodes acts alternately as an anode and as a cathode.

Bipolar pulsed DC sputtering is different from regular AC sputtering, e.g. MF sputtering or RF sputtering, in that the waveform of the voltage is not a sine wave. Rather, the waveform of the voltage may be temporarily essentially constant (direct current, "DC"). For example, a waveform of the bipolar pulsed DC voltage may be a rectangular or square wave. In particular, a positive part of the waveform may be temporarily essentially constant and/or a negative part of the waveform may be temporarily essentially constant, particularly different from a sine wave voltage.

In some embodiments, each electrode of the pairs of electrodes may act alternately as an anode and as a cathode. In particular, no separate electrodes acting continuously as anodes may be provided.

In some embodiments, the frequency of the bipolar pulsed DC voltage may be at least 1 kHz, particularly at least 10 kHz or at least 30 kHz, and/or maximum 100 kHz, particularly maximum 80 kHz or maximum 50 kHz.

In particular, sputtering with a bipolar pulsed DC voltage may enable an improved arcing suppression, may have reduced process stability issues and/or may provide higher layer uniformity control, particularly when compared to conventional DC sputtering. Further, a rectangular waveform voltage in DC bipolar sputtering may enable a reduced loss of deposition rate, particularly when compared to conventional AC sine wave sputtering methods.

In some embodiments, which may be combined with other embodiments described herein, the power supply arrangement may be configured to supply each electrode of the pairs of electrodes, in particular of the at least one first pair of electrodes and the at least one second pair of electrodes, with a positive voltage, particularly a positive DC voltage, and with a negative voltage, particularly with a negative DC voltage. The electrodes of the pairs of electrodes may act alternately as cathodes and as an anodes, particularly with respect to the other electrode of the same pair of electrodes.

In some embodiments, each of the at least one first pair of electrodes and the at least one second pair of electrodes may be connected via a pulsing unit to a DC power supply of the power supply arrangement. The number of pulsing units and/or the number of DC power supplies may correspond to the number of pairs of electrodes. The pulsing unit may be configured for converting a DC voltage provided by the DC power supply to a bipolar pulsed DC voltage.

At least one of the DC power supplies, particularly each DC power supply, may be configured to provide a power of at least 1 kW, particularly of at least 10 kW, and/or of maximum 200 kW, particularly of maximum 100 kW. Alternatively or additionally, at least one of the power supplies, particularly each DC power supply, may be configured to provide a voltage of 100 V or more and 1000 V or less. For example, at the output terminal of the pulsing unit, the voltage amplitude may periodically change between a first value of +500 V and a second value of −500 V.

The term "vacuum" as used in the present disclosure can be understood as a space that is substantially devoid of matter, e.g., a space from which all or most of the air or gas has been removed, except for process gases that are used in a deposition process, such as a sputter deposition process. As an example, the term "vacuum" can be understood in the sense of a technical vacuum having a vacuum pressure of less than, for example, 10 mbar. One or more vacuum pumps, such as turbo pumps and/or cryo-pumps, can be connected to a vacuum chamber, particularly to a first vacuum chamber and/or a second vacuum chamber, providing the vacuum in the vacuum chamber for substrate processing such as depositing of layers.

Embodiments described herein may provide the advantage that at least one of a stability and a mobility of thin-film transistors can be increased. In particular, a process window for the deposition of layers for high stability and high mobility thin-film transistors may be enlarged. More particularly, the stability of thin-film transistors under bias stress and/or thermal stress may be increased. Further, a transistor threshold voltage of a thin-film transistor may be controllable near 0V. Embodiments may provide deposition of layers of thin-film transistors with uniform and stable performance. In particular, deposition may be performed without target imprint, without process drift and/or without arcing.

While the foregoing is directed to embodiments of the disclosure, other and further embodiments of the disclosure may be devised without departing from the scope thereof, and the scope thereof is determined by the claims that follow.

The invention claimed is:

1. A method of depositing layers of a thin-film transistor on a substrate using a sputter deposition source comprising at least one first pair of electrodes and at least one second pair of electrodes, the method comprising:

- moving the substrate to a first vacuum chamber, wherein a first vacuum pump is coupled to the first vacuum chamber;
- depositing a first layer of the layers on the substrate by supplying the at least one first pair of electrodes with bipolar pulsed DC voltage, the first layer forming a front channel of the thin-film transistor, and wherein a first material of the first layer comprises a first metal oxide;
- moving the substrate from the first vacuum chamber to a second vacuum chamber without a vacuum break, wherein a second vacuum pump is coupled to the second vacuum chamber and the first vacuum chamber shares a chamber wall with the second vacuum chamber;
- depositing a second layer of the layers on the first layer by supplying the at least one second pair of electrodes with a bipolar pulsed DC voltage, the second layer forming a back channel of the thin-film transistor, wherein a second material of the second layer comprises a second metal oxide, and the second material being different from the first material;
- wherein moving the substrate from the first vacuum chamber to the second vacuum chamber comprises continuously moving the substrate from the first vacuum chamber to the second vacuum chamber through a slit opening of the chamber wall separating the first vacuum chamber and the second vacuum chamber from each other, during depositing the first layer and the second layer; and
- wherein the first material comprises a lower carrier concentration than the second material, wherein the first material comprises a first carrier mobility lower than 30 $cm^2/Vs$, and the second material comprises a second carrier mobility higher than 30 $cm^2/Vs$.

2. The method of claim 1, wherein one of the first metal oxide and the second metal oxide comprises a different metal with respect to the other one of the first metal oxide and the second metal oxide.

3. The method of claim 1, wherein the first metal oxide comprises elements in a first stoichiometry, and wherein the second metal oxide comprises the elements in a second stoichiometry, the second stoichiometry being different from the first stoichiometry.

4. The method of claim 3, wherein the elements comprise at least two selected from the group consisting of indium, gallium and zinc.

5. The method of claim 1, wherein one of the first material and the second material further comprises a further metal oxide or wherein the first material and the second material have different contents of a further metal oxide; and wherein the further metal oxide comprises at least one of tin oxide, aluminum oxide and a transparent conductive oxide.

6. The method of claim 5, wherein the transparent conductive oxide comprises ITO, IZO or AZO.

7. The method of claim 1, wherein at least one of the first metal oxide and the second metal oxide is IGZO, IZTO, IGZTO, IZO, ITO or AZO.

8. The method of claim 1, wherein the substrate is continuously moved during depositing the first layer and during depositing the second layer.

9. The method of claim 1, wherein the first layer is deposited on a gate insulation layer.

10. The method of claim 1, wherein the method further comprises:

- moving the substrate from the second vacuum chamber to a third vacuum chamber without a vacuum break; and
- depositing a third layer of the layers on the second layer.

11. The method of claim 10, wherein the third layer is deposited by a third pair of electrodes.

12. The method of claim 1, wherein one of the first material and the second material further comprises a further metal oxide or wherein the first material and the second material have different contents of a further metal oxide; and wherein the further metal oxide comprises at least one of tin oxide, aluminum oxide, ITO, IZO and AZO.

13. The method of claim 1, wherein the method further comprises:

- moving the substrate from the second vacuum chamber to a third vacuum chamber without a vacuum break; and
- depositing a third layer of the layers on the second layer using at least one third pair of electrodes.

14. The method of claim 1, wherein the first material second material comprises a carrier mobility less than 7 $cm^2/Vs$.

15. The method of claim 1, wherein the first metal oxide includes an element in a first oxidation state and the second metal oxide includes the element in a second oxidation state, the second oxidation state being different from the first oxidation state.

16. A sputter deposition apparatus, comprising:

- a first vacuum chamber coupled to a first vacuum pump and a second vacuum chamber coupled to a second vacuum pump being arranged such that a substrate is transferrable between the first vacuum chamber and the second vacuum chamber without a vacuum break, through a slit opening provided in a chamber wall, wherein the first vacuum chamber shares the chamber wall with the second vacuum chamber; and
- a sputter deposition source comprising:
  - at least one first pair of electrodes and at least one second pair of electrodes, wherein the at least one first pair of electrodes is arranged in the first vacuum chamber and wherein the at least one second pair of electrodes is arranged in the second vacuum chamber; and
  - a power supply arrangement configured to supply the at least one first pair of electrodes and the at least one second pair of electrodes with bipolar pulsed DC voltage;

wherein the at least one first pair of electrodes comprises first targets having a first target material, the first target material comprising a first metal oxide, the first target material forming a first layer of a thin-film transistor, and the first layer forming a front channel of the thin-film transistor;

wherein the at least one second pair of electrodes comprises second targets having a second target material, the second target material comprising a second metal oxide, the second target material being different from the first target material, the second target material forming a second layer of the thin-film transistor, and the second layer forming a back channel of the thin-film transistor;

wherein the first vacuum chamber, the second vacuum chamber and the sputter deposition source are arranged such that the substrate is transferrable between the first vacuum chamber and the second vacuum chamber by continuously moving the substrate from the first vacuum chamber to the second vacuum chamber through the slit opening during depositing the first layer on the substrate using the at least one first pair of electrodes and during depositing the second layer on the substrate using the at least one second pair of electrodes; and wherein the first target material comprises a lower carrier concentration than the second target material, wherein the first target material comprises a first carrier mobility lower than 30 $cm^2/Vs$, and the second target material comprises a second carrier mobility higher than 30 $cm^2/Vs$.

17. The sputter deposition apparatus of claim 16, wherein the first targets and the second targets are rotary targets.

18. A method of depositing layers of a layered channel of a thin-film transistor on a substrate using a sputter deposition source comprising at least one first pair of electrodes, at least one second pair of electrodes and at least one third pair of electrodes, the method comprising:

moving the substrate to a first vacuum chamber, wherein a first vacuum pump is coupled to the first vacuum chamber;

depositing a first layer of the layers on the substrate by supplying the at least one first pair of electrodes with bipolar pulsed DC voltage, the first layer forming a front channel of the thin-film transistor, and wherein a first material of the first layer comprises a first metal oxide;

moving the substrate from the first vacuum chamber to a second vacuum chamber without a first vacuum break, wherein a second vacuum pump is coupled to the second vacuum chamber and the first vacuum chamber shares a first chamber wall with the second vacuum chamber;

depositing a second layer of the layers on the first layer by supplying the at least one second pair of electrodes with a bipolar pulsed DC voltage, the second layer forming an intermediate channel layer of the thin-film transistor, wherein a second material of the second layer comprises a second metal oxide, and the second material being different from the first material; and moving the substrate from the second vacuum chamber to a third vacuum chamber without a second vacuum break, wherein a third vacuum pump is coupled to the third vacuum chamber and the second vacuum chamber shares a second chamber wall with the third vacuum chamber; and depositing a third layer of the layers on the second layer by supplying the at least one third pair of electrodes with a bipolar pulsed DC voltage, wherein a third material of the third layer comprises a third metal oxide, and the third material being different from the second material;

wherein moving the substrate from the first vacuum chamber to the second vacuum chamber comprises continuously moving the substrate from the first vacuum chamber to the second vacuum chamber through a slit opening of the first chamber wall separating the first vacuum chamber and the second vacuum chamber from each other, during depositing the first layer and the second layer; and wherein the first material comprises a lower carrier concentration than the second material, wherein the first material comprises a first carrier mobility lower than 30 $cm^2/Vs$, and the second material comprises a second carrier mobility higher than 30 $cm^2/Vs$, and wherein the third material has a different carrier mobility with respect to the second material.

* * * * *